Dec. 8, 1959 G. FREEDMAN 2,916,408

FABRICATION OF JUNCTION TRANSISTORS

Filed March 29, 1956

INVENTOR
GEORGE FREEDMAN
BY Elmer J. Gorn
ATTORNEY

United States Patent Office 2,916,408
Patented Dec. 8, 1959

2,916,408

FABRICATION OF JUNCTION TRANSISTORS

George Freedman, Newton, Mass., assignor to Raytheon Company, a corporation of Delaware Application March 29, 1956, Serial No. 574,644

2 Claims. (Cl. 148—1.5)

This invention relates generally to electrical translation devices, and more particularly to novel structures and methods of making semiconductive devices of the type known as junction transistors.

Recent years have witnessed the discovery and development of a new class of electrical translation device utilizing a body of semiconductive material, as, for example, germanium or silicon, which is provided with an impurity element which alters the electrical conductivity characteristics of the semiconducting material, and thereby makes it possible for these devices to perform amplifying, rectifying, and, in some cases, oscillating functions. The impurity materials which are included in the body of the semiconducting material are chosen from the third and fifth groups of the Periodic Table according to Mendelyeev, those from the third group being designated as P-type impurities, while those from the fifth group are designated as N-type impurities. When an area of the semiconductor body is provided with a prominence of P-type impurity atoms, the area is said to be a P-type region or zone, and electrical conduction through the region will be primarily by "holes" as is well known in the art. Conversely, when an area of the semiconductor body is provided with a prominence of N-type impurity atoms, the area is said to be an N-type region or zone, and electrical conduction through the region is primarily by electrons. The interface between a P-type region and an N-type region acts as a rectifying barrier, and is known as a P–N (N–P) junction.

One type of such device comprises a body of semiconductive material having a region of one conductivity type material, such as an N-type region, intermediate to regions of opposite conductivity type material, such as P-type regions, and has been designated as a junction transistor.. The intermediate N-type region constitutes the base region, while the two outer P-type regions may be termed the emitter and collector regions. The interface between the emitter and base regions constitutes the emitter junction, while the interface between the collctor and base regions constitutes the collector junction. In the fabrication of these devices, a difficult manufacturing problem resides in accurately controlling the width of the above-referred to base region. Since many of the desirable characteristics of these devices depend upon making the width of this intermediate region as small as possible, it is imperative that a highly reliable method of controlling this width be provided.

Accordingly, the present invention is directed toward a novel method of constructing a junction transistor wherein the distance between the emitter and collector junctions may be accurately controlled. To accomplish this result, the semiconductive body or chip is first provided with an internal junction which may be made in any conventional manner, as, for example, by making the junction during the growth of the crystal from which the chip is subsequently sliced, or by alloying an appropriate impurity material into the body. An appropriate electrical conductor is attached to one face of the chip, as by soldering, in order to provide a connection which will function as the collector electrode in the completed structure. An electrode which contains an impurity material opposite to the impurity type of the opposite face of the chip may then be placed in contact with said face, and then supplied with a pulse of current which forces the electrode into the chip and converts a portion of the chip beneath the point of contact to a conductivity type corresponding to the impurity material contained in the electrode. The depth to which the electrode penetrates the chip may then be measured by appropriate conventional apparatus, and if optimum electrical characteristics are not achieved as indicated by the measurement, a second current pulse may then be supplied to the electrode. The depth of penetration may again be measured, and the above-described process repeated until optimum electrical characteristics are obtained. A second electrode which contains an impurity material which is of the same type as that in the portion of the chip to which the first electrode is attached may also be pulsed into the same face of the chip as the first electrode in order to provide an electrical connection to the base region, and thus complete the transistor structure. This pulsing operation may be done simultaneously with the pulsing of the first or emitter electrode. Thus, the width between emitter and collector junctions may be accurately controlled by the operator of the pulsing equipment.

The invention will be better understood as the following description proceeds, taken in conjunction with the accompanying drawing wherein.

Figure 1:
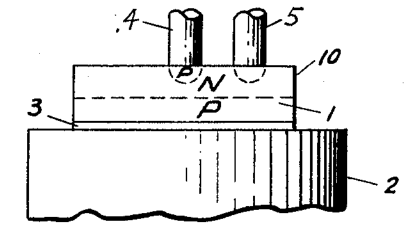
Fig. 1 is a greatly expanded diagrammatic representation of a transistor structure in accordance with the invention.
Figure 2:
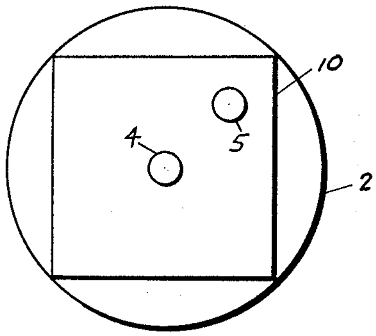
Fig. 2 is a plan view of the structure of Fig. 1.
Figures 3, 4:
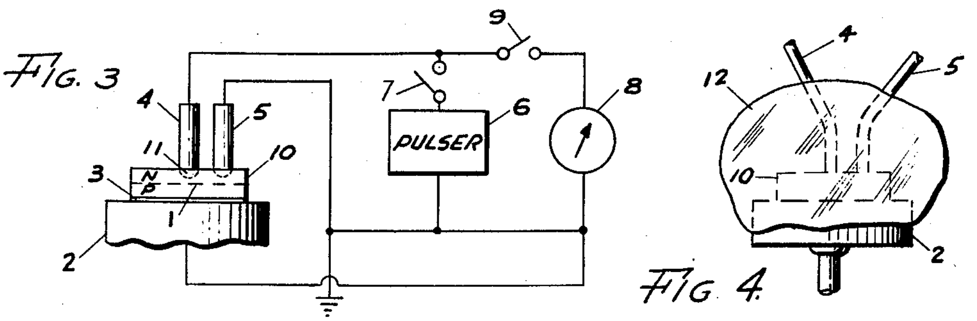
Fig. 3 is a schematic diagram of an electrical circuit useful in performing the pulsing operation.
Fig. 4 shows the structure of Fig. 1 after encapsulation in a suitable protective material.

Referring now to the drawing, and more particularly to Figs. 1 and 3 thereof, numeral 10 designates a chip of semiconductive material, which may be germanium, which has been provided with a P–N junction 1. The junction 1 may be formed in any conventional manner as by properly doping a germanium crystal during growth to form a so-called grown junction, or by diffusing an appropriate impurity material into a chip, which initially is wholly of one conductivity type. A metallic plug 2, which may be brass, is attached to the under or P-type side of chip 1 in any convenient manner, as, for example, by a layer of indium solder 3. Brass plug 2 serves as the collector electrode for the completed transistor unit. After attachment of plug 2 to chip 10, electrodes 4 and 5 may be placed in contact with the upper or N-type surface of chip 10. Electrode 4 should contain an impurity material which is opposite to the type of impurity contained in the upper portion of chip 10, while electrode 5 should contain an impurity material of the same type as exists in the upper portion of chip 10. A gold-gallium alloy wire has been found suitable for use as electrode 4, and a gold-antimony alloy wire may be used as electrode 5. A source of pulsing current 6 may then be connected between electrodes 4 and 5, the circuit between said electrodes including a switch 7. A suitable testing apparatus 8 may be connected in parallel with pulser 6, this circuit also being provided with a switch 9. Apparatus 8 may be, for example, a conventional beta test set, or a conventional alpha cutoff test set, either of which may be calibrated to give a reading which is a function of the base width of the transistor.

After connection, as indicated above, a pulsing current from pulser 6 may be sent through electrode 4 whereupon the point of contact between electrode 4 and chip 10 will melt and a P-type area 11 will be formed under the electrode 4, the interface between P-type area 11 and the rest of the upper portion of chip 10 constitute a P–N junction. Electrode 5 will be simultaneously fused to chip 10, but since electrode 5 contains an impurity material, which is the same as that contained in the upper portion of chip 10, no junction will be formed. Thus, electrode 4 constitutes the emitter electrode while electrode 5 constitutes the base electrode. After the application of a current pulse, switch 7 may be opened, and switch 9 may be closed in order to measure the depth of penetration of electrode 4, which will appear on the measuring apparatus 8 as a function of the base width between P-type area 11 and junction 1. If the reading on apparatus 8 indicates that the optimum electrical characteristics have not been achieved, additional current pulses may be sent through electrode 4 until an optimum depth of penetration results. In this way, the space between the P region 11 and the junction 1 may be accurately controlled by the operator of the pulsing equipment, or the equipment may be arranged to automatically control the penetration depth without the need of an attendant operator.

Figure 5:
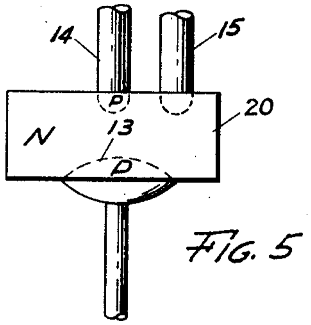
Fig. 5 shows another embodiment of the invention wherein the first junction is formed by alloying an impurity into the semiconductive body.

After completion of the electrode attachment operation, the transistor structure may be finished by encapsulating chip 10 and leads 4 and 5 in a suitable protective housing 12, which may be of a plastic material, as shown in Fig. 4. It should be understood that the original junction 1 in chip 10 may be formed in other ways than those described. For example, the junction may be formed by alloying a suitable impurity material into a chip 20 thereby forming an alloy junction 13, as shown in Fig. 5. Electrodes 14 and 15 may then be attached to chip 20 in the above-described manner.

Although there have been described what are considered to be preferred embodiments of the present invention, various adaptations and modifications thereof may be made without departing from the spirit and scope of the invention as defined in the appended claims.

What is claimed is:

1 The method of making a semiconductive device, said method comprising first providing a semiconductive body with two regions of different electrical conductivity-type material, the interface between said two regions constituting a first P–N junction, placing a first electrode in contact with one of said regions, said first electrode containing an impurity material opposite to that which exists in the portion of said body with which it is in contact, passing an electric current through said first electrode and through a second electrode positioned on the same side of said first junction as said first electrode to convert a portion of said body under said first electrode to the same electrical conductivity-type material as the impurity in said first electrode whereby a second P–N junction is created, and intermittently and selectively passing pulses of additional current through said electrodes to cause said second P–N junction to be moved progressively closer to said first P–N junction while maintaining the physical position of said first P–N junction substantially constant in said body.

2. The method of making a semiconductive device, said method comprising first providing a semiconductive body with two regions of different electrical conductivity-type material, the interface between said two regions constituting a first P–N junction, placing a first electrode in contact with one of said regions, said electrode containing an impurity material opposite to that which exists in the region of said body with which it is in contact, placing a second electrode in contact with said one region, said second electrode containing an impurity material of the same type which exists in the region with which it is in contact, passing an electric current through said first and second electrodes whereby a portion of said body under said first electrode is converted to the same electrical conductivity-type material as the impurity in said first electrode and creates a second P–N junction, said electric current being prevented from crossing said first P–N junction, and intermittently passing additional current pulses through said electrodes to move said second P–N junction progressively closer to said first P–N junction while maintaining the physical position of said first P–N junction substantially constant in said body.

References Cited in the file of this patent

UNITED STATES PATENTS

| | | |
|---|---|---|
| 2,654,059 | Shockley | Sept. 29, 1953 |
| 2,697,269 | Fuller | Dec. 21, 1954 |
| 2,757,323 | Jordan et al. | July 31, 1956 |
| 2,793,332 | Alexander et al. | May 21, 1957 |

FOREIGN PATENTS

| | | |
|---|---|---|
| 738,216 | Great Britain | Oct. 12, 1955 |
| 1,038,658 | France | May 13, 1953 |